(12) United States Patent
Henne et al.

(10) Patent No.: US 11,894,838 B2
(45) Date of Patent: Feb. 6, 2024

(54) DEVICE FOR CONTROLLING SEMICONDUCTOR CIRCUIT BREAKERS IN THE HIGH-VOLTAGE RANGE

(71) Applicant: Webasto SE, Stockdorf (DE)

(72) Inventors: Alexander Henne, Amberg (DE); Hans Rechberger, Baierbrunn (DE); Karlheinz Fleder, Munich (DE)

(73) Assignee: WEBASTO SE, Stockdorf (DE)

( * ) Notice: Subject to any disclaimer, the term of this patent is extended or adjusted under 35 U.S.C. 154(b) by 0 days.

(21) Appl. No.: 17/606,731

(22) PCT Filed: May 6, 2020

(86) PCT No.: PCT/EP2020/062587
§ 371 (c)(1),
(2) Date: Oct. 26, 2021

(87) PCT Pub. No.: WO2020/225306
PCT Pub. Date: Nov. 12, 2020

(65) Prior Publication Data
US 2022/0224326 A1 Jul. 14, 2022

(30) Foreign Application Priority Data

May 8, 2019 (DE) .......................... 102019111996.0

(51) Int. Cl.
*H03K 17/56* (2006.01)
*H03K 19/0175* (2006.01)

(52) U.S. Cl.
CPC ..... *H03K 17/56* (2013.01); *H03K 19/017509* (2013.01)

(58) Field of Classification Search
CPC ...... H03K 17/10; H03K 17/102; H03K 17/12; H03K 17/122; H03K 17/16; H03K 17/161;
(Continued)

(56) References Cited

U.S. PATENT DOCUMENTS 6,008,549 A * 12/1999 Cooper ................. H02M 1/088
307/139
2010/0013548 A1* 1/2010 Barrow ................... H02M 1/36
327/536
(Continued)

FOREIGN PATENT DOCUMENTS

JP 2007006207 A 1/2007
JP 2017055542 12/2017
(Continued)

OTHER PUBLICATIONS

International Search Report for PCT/EP2020/062587 dated Jul. 30, 2020.

*Primary Examiner* — Quan Tra
(74) *Attorney, Agent, or Firm* — Concept IP LLP; Michael Zarrabian

(57) ABSTRACT

The invention relates to a device for controlling a plurality of semiconductor circuit breakers by means of driver voltages for the synchronous operation of a plurality of loads in the high-voltage range, where the driver voltages can be provided by a transformer. According to the invention, the driver voltages for the semiconductor circuit breakers are tapped from a single secondary winding of the transformer, where electronic voltage level converter circuits are provided to obtain the driver voltages from the secondary winding of the transformer at the required magnitude.

9 Claims, 2 Drawing Sheets

(58) Field of Classification Search
CPC .... H03K 17/30; H03K 17/302; H03K 19/003; H03K 19/00307; H03K 19/00315; H03K 19/00346; H03K 19/00353; H03K 19/00361; H04L 25/026
USPC .......................................................... 327/108
See application file for complete search history.

(56) References Cited

U.S. PATENT DOCUMENTS

| | | | |
|---|---|---|---|
| 2011/0260707 A1* | 10/2011 | Imanishi | ................ H02M 1/08 |
| | | | 323/311 |
| 2011/0305048 A1 | 12/2011 | Yang et al. | |
| 2016/0099650 A1 | 4/2016 | Yabumoto et al. | |
| 2017/0070220 A1 | 3/2017 | Yoshida et al. | |
| 2017/0250686 A1 | 8/2017 | Liu | |
| 2020/0220534 A1* | 7/2020 | Koyama | .............. H03K 17/567 |

FOREIGN PATENT DOCUMENTS

| | | | |
|---|---|---|---|
| WO | 2015016146 A1 | 2/2015 | |
| WO | 2015079569 A1 | 6/2015 | |

* cited by examiner

DEVICE FOR CONTROLLING SEMICONDUCTOR CIRCUIT BREAKERS IN THE HIGH-VOLTAGE RANGE

CROSS-REFERENCE TO RELATED APPLICATIONS

This application is a 35 U.S.C. § 371 National Stage Entry of International Application No. PCT/EP2020/062587 filed May 6, 2020, which claims the priority benefit of German Patent Application Serial Number DE 102019111996.0 filed May 8, 2019, all of which are incorporated herein by reference in their entirety for all purposes.

The invention relates to a device for simultaneously controlling a plurality of semiconductor power switches in the case of pulsed loads in the high-voltage range.

The control of semiconductor power switches by means of conventional devices of the type mentioned in the introduction will be explained with reference to FIGS. 1 and 2.

Figure 1:
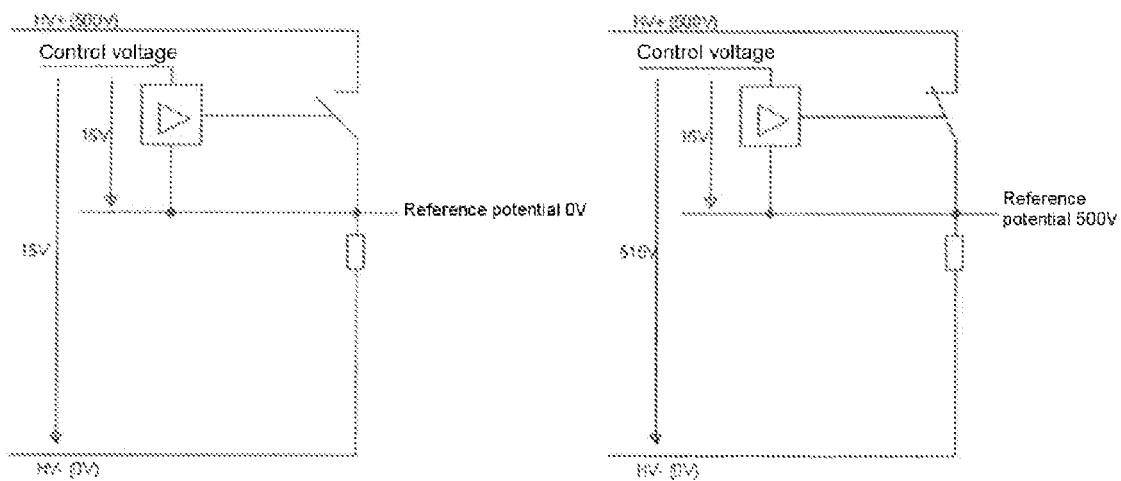

As shown in FIG. 1, for the control of two semiconductor power switches (MOSFETs, IGBTs, bipolar transistors), the voltage of 15 V required for control at the control input (gate, base), with the switch turned on, must always have a defined potential difference with respect to a reference level. If this were not the case, the switch could not be switched on. In the worst case, this can even lead to the destruction of the semiconductor power switch. In the high-voltage application shown in FIG. 1, the reference level can be e.g. at 0 V (circuit variant on the left in FIG. 1) or 500 V (circuit variant on the right in FIG. 1), and it can even jump from 0 V to 500 V when the power switch is turned off or turned on (high-side problem).

Figure 2:
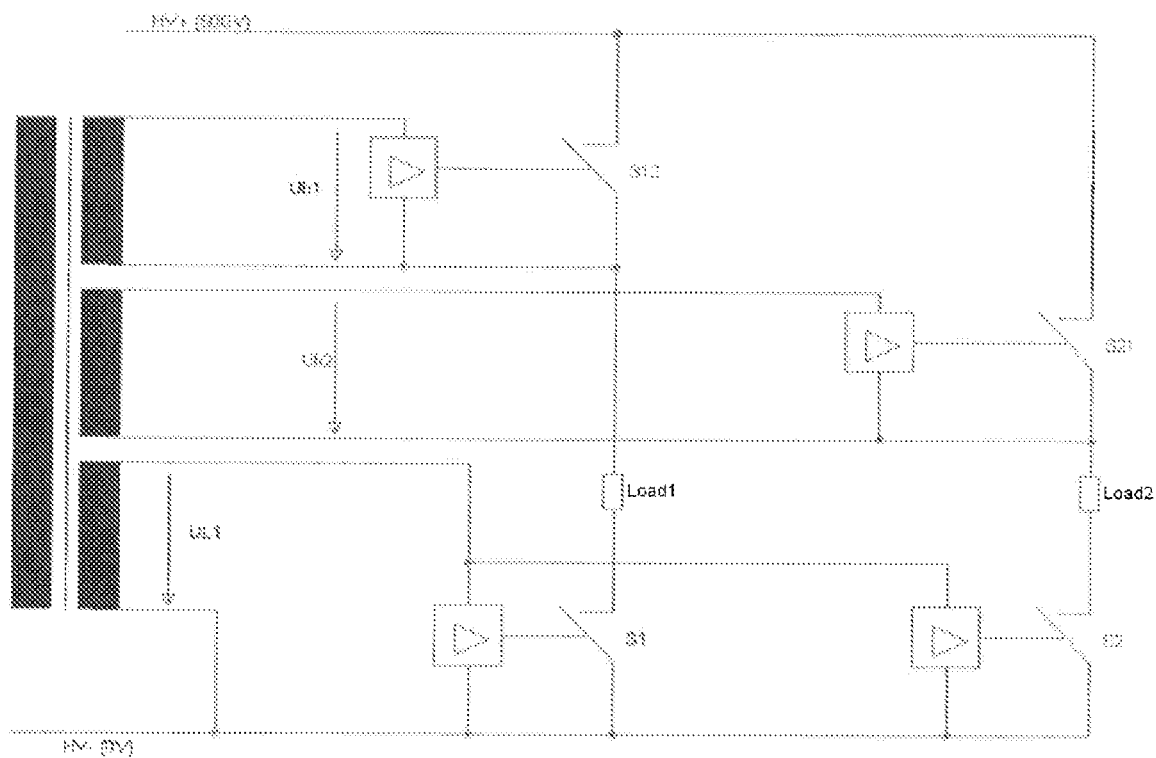

For the application in the high-voltage range as shown by way of example in FIG. 2, driver voltages UL1, $UH_1$ and $UH_2$ are generated by means of a transformer with a plurality of output voltages, which provide the driver voltages at different reference levels in a galvanically isolated manner. In specific detail, a first load Load 1 and a second load Load 2 are cyclically connected to the zero potential HV– and the positive potential HV+ of 500 volts, for example, respectively via a pair of electronic power switches S1, S12 and S2, S21. The driver voltage UL1 for controlling the switch S1 is tapped off from a first secondary winding of the transformer (the lower secondary voltage of the transformer in FIG. 2). The driver voltage $Uh_1$ for controlling the switch S12 is tapped off from a second secondary winding of the transformer (the upper secondary voltage of the transformer in FIG. 2). The driver voltage $Uh_2$ for controlling the switch S21 is tapped off from a third secondary winding of the transformer (the upper secondary voltage of the transformer in FIG. 2). The high voltage is applied to the respective load Load 1 and Load 2 when switches S1, S12 and S2, S21 are closed, and is disconnected from said load when the switches are open.

On account of the compact winding construction, electromagnetic interference caused by clocking of the power semiconductors is transmitted to the primary side of the transformer. In automotive applications, the interference generated in the HV part of the device is thus transmitted to the low-voltage side. Moreover, the interference generated can lead to voltage spikes on the further secondary windings of the transformer. Said interference has to be reduced in a relatively complex manner with the aid of EMC filter components. A further disadvantage of the method is the use of a transformer having a plurality of secondary windings. The latter are complex and expensive owing to the required dielectric strength and the use of high-quality and thus more expensive insulation materials.

It is an object of the invention to provide a device such that said device can be produced in an optimized manner in terms of EMC and cost-effectively.

This object is achieved by means of the features of claim 1. Advantageous developments of the invention are defined in the dependent claims.

The invention accordingly provides a device for controlling a plurality of semiconductor power switches by means of driver voltages for the clocked operation of a plurality of loads in the high-voltage range. They are provided via a transformer, wherein the driver voltages for the semiconductor power switches are derived from a single secondary winding of the transformer. Voltage level shifter circuits are provided, which obtain driver voltages with the required voltage level from the voltage generated in the secondary winding of the transformer.

It is preferably provided that only one transformer having only one secondary winding is required. The driver voltages for an arbitrary number of PWM-controlled loads are preferably generated in each case by way of simple electronic voltage level shifter circuits.

The device according to the invention is more compact in comparison with that according to the prior art with a plurality of secondary windings and has less EMC interference.

The outlay for transformer and EMC filter components is reduced and results in a significant cost saving.

The electronic voltage level shifter circuits are based on the concept of a charge pump. The term charge pump encompasses a plurality of different electrical circuits which increase the value of electrical voltages or reverse the polarity of DC voltages.

Charge pumps can be used as voltage shifters wherever high output currents are not required or suitable magnetic components such as coils cannot be used.

Charge pumps set their voltages to a different value by means of a temporal sequence between charging of capacitors and cascading. This is realized by periodic switching over of switches.

The processes are similar to those of a reciprocating piston pump. Charging of the capacitors corresponds to the filling of the cylinder, and cascading corresponds to the raising of the cylinder. Diodes preferably act as electronic switches, which diodes are switched by potential differences in each case into off-state or on-state ranges and charge capacitors or boost their voltage. Charge pumps, multiply cascaded, can generate very high DC voltages. Such circuits are referred to as a high-voltage cascade.

It is advantageous that the clocking of the respective load serves for the clocking of the respective charge pump; in particular, the PWM pulse of the respective load is used for the clocking of the charge pump. Its circuit design is greatly simplified as a result.

Preferably, the clocking of the device is effected in each case via a switch which is connected to the secondary winding of the transformer, which charges the charge pump in the closed state, and which applies the driver voltage generated in the charge pump to the respective semiconductor power switch in the open state. The charge pump clocking is preferably effected in each case via a PWM-switched power switch Sn. In this regard, e.g. in the closed state of S1, the capacitor C1 is charged to voltage UL1 via D1-R1. In the open state, C1 is discharged via D12 to C12. Diode D1 turns off and the charged capacitor is set to the reference level of the power switch S12. With Uh1=UL1=15V the driver of S12 is supplied with the necessary voltage.

Figure 3:
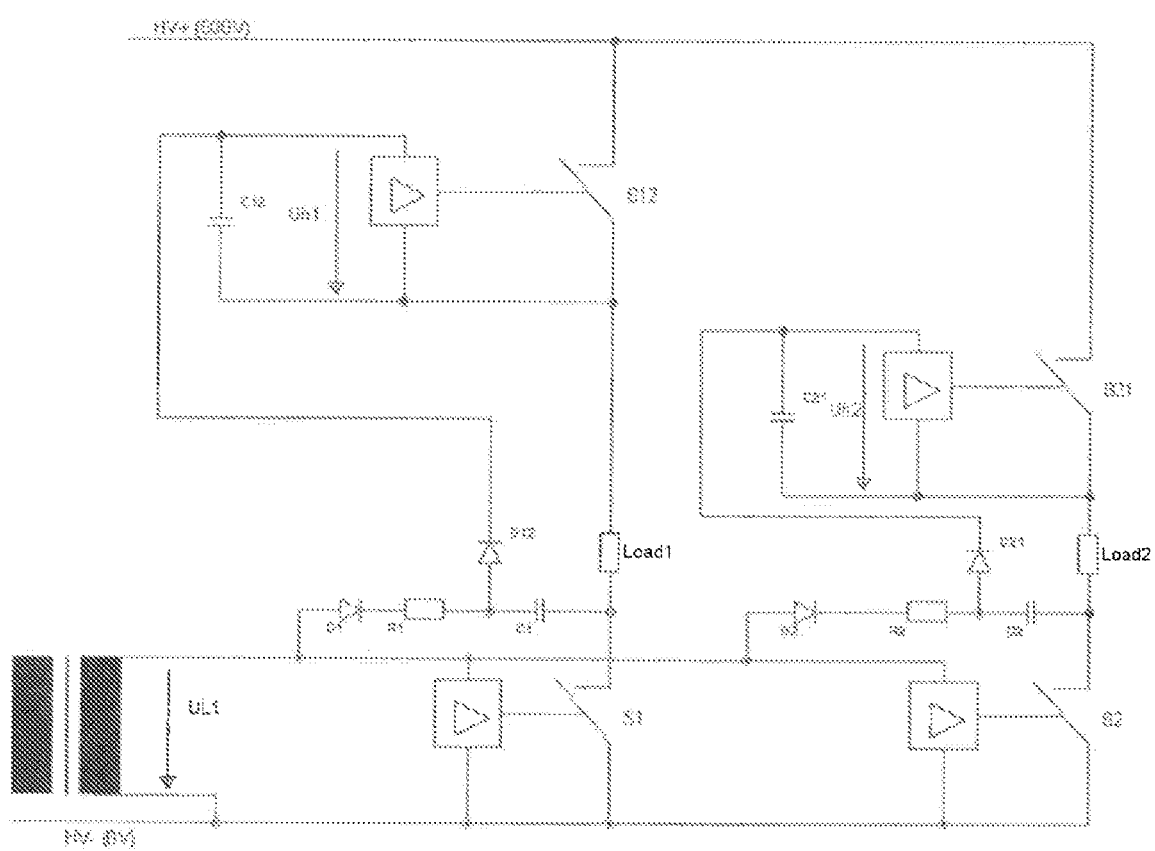

The invention is explained in greater detail below with reference to the drawing, in which:

FIG. 1 shows generally the control of semiconductor power switches (MOSFETs, IGBTs, bipolar transistors) in accordance with the prior art, FIG. 2 shows an application of the control from FIG. 1 in the high-voltage range by means of a transformer for the galvanic isolation of the respective driver voltages for the power switches, wherein the driver voltages for the power switches are galvanically isolated by means of secondary windings of the transformer, and FIG. 3 shows an embodiment of the device according to the invention for controlling power switches by means of a transformer having a single secondary winding, from which the various driver voltages for the power switches are derived.

FIGS. 1 and 2 have been explained in the introductory part concerning the prior art.

An embodiment of the device according to the invention is shown in FIG. 3. This embodiment differs from the device shown in FIG. 2 in the use of a transformer having a single secondary winding for providing the driver voltage UL1 for the electronic load switches S1, S2, to put it more precisely to the two electronic load switches S1 and S2 by means of the lower secondary winding of the transformer with three levels of the zero potential HV−.

For the device in FIG. 3, the driver voltages $Uh_1$ and $Uh_2$ for controlling the electronic load switches S12 and S21 are not provided by further secondary windings of the transformer, but rather are derived from the single secondary winding of the transformer by means of charge pumps.

The charge pump for providing the driver voltage $Uh_1$ comprises a capacitor C1 connected at one end to that end of the load Load 1 which is connected to the switch S1, and at the other end via a series resistor R1, the other end of which is connected to a diode D1 at UL1 potential. The driver voltage $Uh_1$ generated from the voltage UL1 by way of the charge pump is applied via a diode D12 to the electronic switch S12 bridged by a capacitor C12 on the input side.

The charge pump for providing the driver voltage $Uh_2$ comprises a capacitor C2 connected at one end to that end of the load Load 2 which is connected to the switch S2, and at the other end via a series resistor R2, the other end of which is connected to a diode D2 at UL1 potential. The driver voltage $Uh_2$ generated from the voltage UL1 by way of the charge pump is applied via a diode D12 to the electronic switch S12 bridged by a capacitor C21 on the input side.

If the switch S1 is closed, the capacitor C1, C2 is charged to the driver voltage potential UL via the series resistor R1, R2 and the blocking diode D1, D2.

If the switch S1, S2 is opened, the capacitor C12, C21 is charged with the charge of the capacitor C1, C2. The potential $Uh_1(Uh_2)$=UL required for controlling the switch S12, S21 is thus available. This process is repeated cyclically with the clocking of the switches S1, S2.

The device according to the invention has been explained on the basis of an embodiment with two semiconductor power switches. However, the invention is not restricted thereto. Rather, more than two switches of this type are taken into consideration for the device for controlling semiconductor power switches.

The invention claimed is:

1. A device for simultaneously controlling a plurality of semiconductor power switches in the case of pulsed loads in the high-voltage range,
    wherein the driver voltages of the plurality of semiconductor power switches are provided via a transformer,
    wherein the driver voltages for the plurality of semiconductor power switches are derived from the voltage of a single secondary winding of the transformer,
    wherein electronic voltage level shifter circuits are provided in order to obtain the driver voltages at the required magnitude from the secondary winding of the transformer,
    wherein the electronic voltage level shifter circuits each comprise a charge pump,
    wherein one end of the respective load is connected to a corresponding semiconductor power switch of the plurality of semiconductor power switches and the other end of the respective load is connected to a switch which is connected to the secondary winding of the transformer,
    wherein the each of the plurality of semiconductor power switches is bridged by a first capacitor on an input side, and the driver voltages obtained at the required magnitude are applied to the plurality of semiconductor power switches bridged by the respective first capacitor on the input side,
    wherein the charge pump for providing the driver voltage comprises a second capacitor, which is connected at one end to that end of the load which is connected to the switch, which is connected to the secondary winding of the transformer, and
    wherein, when the switch is closed, the second capacitor is charged to the driver voltage potential, and when the switch is opened, the first capacitor is charged with the charge of the second capacitor.

2. The device as claimed in claim 1, wherein the clocking of the device is effected in each case via a switch which is connected to the secondary winding of the transformer, which charges the charge pump in the closed state, and which applies the driver voltage generated in the charge pump to the respective semiconductor power switch in the open state.

3. The device as claimed in claim 1, wherein the charge pump for providing the driver voltage is connected at one end to that end of the load which is connected to the switch which is connected to the secondary winding of the transformer.

4. The device as claimed in claim 1, wherein the clocking of the respective load serves for the clocking of the respective charge pump.

5. The device as claimed in claim 1, wherein the first capacitor is connected at the other end via a series resistor R1, the other end of which is connected to a diode of the charge pump.

6. A device for simultaneously controlling a plurality of semiconductor power switches in the case of pulsed loads in the high-voltage range,
    wherein the driver voltages of the plurality of semiconductor power switches are provided via a transformer,
    wherein the driver voltages for the plurality of semiconductor power switches are derived from the voltage of a single secondary winding of the transformer,
    wherein electronic voltage level shifter circuits are provided in order to obtain the driver voltages at the required magnitude from the secondary winding of the transformer, wherein the electronic voltage level shifter circuits each comprise a charge pump, wherein the clocking of the respective load serves for the clocking of the respective charge pump, wherein the clocking of the device is effected in each case via a switch which is connected to the secondary winding of the transformer, wherein the each of the plurality of semiconductor power switches is bridged by a first capacitor on an input side, and the driver voltages obtained at the required magnitude are applied to the plurality of semiconductor power switches bridged by the respective first capacitor on the input side, wherein the charge pump for providing the driver voltage comprises a second capacitor, which is connected at one end to that end of the load which is connected to the switch, which is connected to the secondary winding of the transformer, and wherein, when the switch is closed, the second capacitor is charged to the driver voltage potential, and when the switch is opened, the first capacitor is charged with the charge of the second capacitor to apply the driver voltage generated in the charge pump to the respective semiconductor power switch in the open state.

7. The device as claimed in claim 6, wherein the charge pump for providing the driver voltage is connected at one end to that end of the load which is connected to the switch which is connected to the secondary winding of the transformer.

8. The device as claimed in claim 6, wherein the first capacitor is connected at the other end via a series resistor R1, the other end of which is connected to a diode of the charge pump.

9. The device as claimed in claim 6, wherein one end of the respective load is connected to a corresponding semiconductor power switch of the plurality of semiconductor power switches and the other end of the respective load is connected to a switch which is connected to the secondary winding of the transformer.

\* \* \* \* \*